(12) United States Patent  
Hayashi et al.

(10) Patent No.: US 10,905,008 B2  
(45) Date of Patent: Jan. 26, 2021

(54) WIRING BOARD

(71) Applicant: NGK SPARK PLUG CO., LTD., Nagoya (JP)

(72) Inventors: Takahiro Hayashi, Nagoya (JP); Takuya Hando, Nagoya (JP)

(73) Assignee: NGK SPARK PLUG CO., LTD., Nagoya (JP)

(*) Notice: Subject to any disclaimer, the term of this patent is extended or adjusted under 35 U.S.C. 154(b) by 0 days.

(21) Appl. No.: 16/478,164

(22) PCT Filed: May 11, 2018

(86) PCT No.: PCT/JP2018/018291  
§ 371 (c)(1),  
(2) Date: Jul. 16, 2019

(87) PCT Pub. No.: WO2018/216505  
PCT Pub. Date: Nov. 29, 2018

(65) Prior Publication Data  
US 2019/0373727 A1  Dec. 5, 2019

(30) Foreign Application Priority Data  
May 24, 2017  (JP) ................. 2017-102656

(51) Int. Cl.  
*H05K 1/02*  (2006.01)  
*H05K 1/03*  (2006.01)  
(Continued)

(52) U.S. Cl.  
CPC .......... *H05K 1/116* (2013.01); *H05K 1/0271* (2013.01); *H05K 2201/097* (2013.01);  
(Continued)

(58) Field of Classification Search  
CPC .. H05K 1/02; H05K 1/03; H05K 1/09; H05K 1/11; H05K 1/18; H05K 3/00; H05K 3/12; H05K 3/46  
(Continued)

(56) References Cited

U.S. PATENT DOCUMENTS

| 5,320,894 A | 6/1994 | Hasegawa |
| 7,239,526 B1* | 7/2007 | Bibee ................. H05K 1/0219 361/788 |

(Continued)

FOREIGN PATENT DOCUMENTS

| JP | H04-23495 A | 1/1992 |
| JP | H06-326471 A | 11/1994 |

(Continued)

OTHER PUBLICATIONS

Japan Patent Office, International Search Report and Written Opinion issued in corresponding Application No. PCT/JP2018/018291, dated Aug. 7, 2018.

(Continued)

*Primary Examiner* — Xiaoliang Chen  
(74) *Attorney, Agent, or Firm* — Stites & Harbison, PLLC; Jeffrey A. Haeberlin; James R. Hayne

(57) ABSTRACT

A wiring board includes: a wiring-board body including a first surface and a second surface opposite to the first surface, and including at least one insulator layer; pads formed at at least one of an internal layer boundary plane and the first surface and the second surface defining a first plane; and via conductors connected to corresponding ones of the pads, and arranged in parallel to extend in a thickness direction of the wiring-board body. Each of first and second ones of the pads adjacent to each other in planar view at the first plane is connected to corresponding ones of the via conductors. The via conductors corresponding to the first pad are arranged differently from the via conductors corresponding to the second pad, in planar view.

3 Claims, 4 Drawing Sheets

(51) Int. Cl.
  *H05K 1/09* (2006.01)
  *H05K 1/11* (2006.01)
  *H05K 1/18* (2006.01)
  *H05K 3/00* (2006.01)
  *H05K 3/12* (2006.01)
  *H05K 3/46* (2006.01)

(52) U.S. Cl.
  CPC ............... *H05K 2201/0979* (2013.01); *H05K 2201/09409* (2013.01); *H05K 2201/09454* (2013.01); *H05K 2201/09609* (2013.01); *H05K 2201/09636* (2013.01); *H05K 2201/09672* (2013.01)

(58) Field of Classification Search
  USPC ........ 174/262, 251, 255, 257, 258; 361/788, 361/795; 257/533, 665, 760, 774
  See application file for complete search history.

(56) References Cited

U.S. PATENT DOCUMENTS

| | | | | |
|---|---|---|---|---|
| 8,946,898 | B2* | 2/2015 | Takahashi | H01L 31/02002 257/760 |
| 10,187,970 | B2* | 1/2019 | Kogure | H01L 23/49894 |
| 2005/0029632 | A1* | 2/2005 | McKinzie, III | H01P 1/16 257/665 |
| 2007/0120223 | A1* | 5/2007 | McKinzie, III | H01P 1/16 257/533 |
| 2008/0227311 | A1* | 9/2008 | Chan | H05K 1/0216 439/74 |
| 2008/0277786 | A1 | 11/2008 | Chen et al. | |
| 2012/0018193 | A1* | 1/2012 | Hong | H05K 1/0265 174/251 |
| 2013/0319737 | A1* | 12/2013 | Hurwitz | H01L 23/3677 174/257 |
| 2015/0107880 | A1* | 4/2015 | Kim | H05K 1/185 174/255 |
| 2015/0189751 | A1* | 7/2015 | Akahoshi | H05K 3/427 174/262 |
| 2017/0148868 | A1* | 5/2017 | Lindert | H05K 1/182 |
| 2017/0208677 | A1 | 7/2017 | Kogure et al. | |
| 2018/0168039 | A1 | 6/2018 | Numagi et al. | |

FOREIGN PATENT DOCUMENTS

| | | |
|---|---|---|
| JP | 2012-028730 A | 2/2012 |
| WO | 2016/052284 A1 | 4/2016 |

OTHER PUBLICATIONS

USPTO, Office Action in U.S. Appl. No. 16/504,673, dated Jun. 16, 2020.
The United States Patent and Trademark Office, Office Action issued in U.S. Appl. No. 16/504,673, dated Oct. 30, 2020.

\* cited by examiner

WIRING BOARD

TECHNICAL FIELD

The present invention relates to a wiring board in which via conductors connect pads of an upper side to pads of a lower side, in a thickness direction of a wiring-board body composed of an insulator layer or a stack of insulator layers.

BACKGROUND ART

For example, there are suggested a multi-layer circuit board and a method for manufacturing the same, wherein: the multi-layer circuit board includes a multi-layer insulator board composed of a stack of insulator layers each of which has a wiring pattern, and includes via electrodes connecting in series between the wiring patterns formed at separate layers of the multi-layer insulator board; each of the via electrodes includes a via bundle composed of via units (via conductors) arranged in parallel; and the via bundles, each of which is composed of the via units, are arranged differently in planar view between the via electrodes adjacent to each other in a thickness direction of the multi-layer insulator board (see Patent Document 1). This multi-layer circuit board and the method for manufacturing the same serve to provide the multi-layer circuit board that is improved in problems of short circuit fault between layers of the multi-layer insulator board and between the wiring pattern and the via electrode and is enhanced in electrical characteristics between the via electrodes of minute sizes.

Meanwhile, as for the above multi-layer circuit board, in case that pads are provided at an insulator layer interposed between pairs of upper and lower pads and are arranged in grid in planar view, some of the via conductors connected to corresponding ones of the pads adjacent to each other in a surface at the insulator layer happen occasionally to be aligned in a straight line in planar view. The aligned via conductors are likely to cause the insulator layer a crack in a direction along the surface because, when a stress is generated due to a difference in thermal expansion coefficient between the via conductors and the insulator layer, the stress converges along the aligned via conductors.

Prior Art Document(s)

Patent Document(s)

Patent Document 1: JP 2012-28730 A (pages 1 to 10, FIGS. 1 to 3)

SUMMARY OF THE INVENTION

Problem(s) to be Solved by the Invention

The present invention is intended to solve the problem described in Background Art and provide a wiring board and a method for manufacturing the same, the wiring board hardly causing a crack in an insulator layer due to arrangement of via conductors provided in parallel and in groups between each pair of pads opposite to each other across the insulator layer.

Means for Solving the Problem(s) and Effect(s) of the Invention

To solve the problem, the present invention has been invented based on an idea to vary the arrangement of the via conductors between the pads adjacent to each other in planar view, wherein the via conductors are provided in parallel and in groups between each pair of pads opposite to each other across the insulator layer. According to one aspect of the present disclosure, a wiring board includes: a wiring-board body including a first surface and a second surface opposite to the first surface, and including at least one insulator layer; pads formed at at least one of an internal layer boundary plane and the first surface and the second surface of the wiring-board body, the one defining a first plane; and via conductors connected to corresponding ones of the pads at the wiring-board body, and arranged in parallel to extend in a thickness direction of the wiring-board body, wherein: each of first and second ones of the pads adjacent to each other in a plan view at the first plane is connected to corresponding ones of the via conductors; and the via conductors corresponding to the first pad are arranged differently from the via conductors corresponding to the second pad, in the plan view.

This wiring board can produce the following effect (1).
(1) Each pad is connected to a plurality of the via conductors (namely, a via group). The arrangement of the plurality of via conductors (namely, positions of the via conductors on one pad) is different between the pads adjacent to each other in planar view at one of the first surface and the second surface and the internal layer boundary plane. This suppresses the via conductors connected to the pads adjacent to each other at the same plane from being aligned in a straight line in planar view, and thereby suppresses a crack from being caused in the wiring board by a stress due to a difference in thermal expansion coefficient between the via conductors and the insulator layer. Thus, the wiring board is improved in precision of its shape and dimensions, and in stability of its electrical characteristics.

Each of the insulator layers is made of ceramic such as alumina or resin such as epoxy-based one, for example. Each of the pads includes a via cover interposed between groups of the via conductors, the groups formed respectively in the insulator layers adjacent to each other in the thickness direction of the wiring-board body. The pads serve also as first-surface pads at the first surface of the wiring-board body or second-surface pads at the second surface of the wiring-board body. The pads may be provided in boundaries between the insulator layers so as to partially form internal layer wiring that shows a specific pattern in planar view. Each of the internal layer boundary planes is a boundary between the insulator layers adjacent to each other in the thickness direction. The above "arrangement" includes a predetermined arrangement pattern. The via conductors form in parallel a conduction path between the pads at the first surface and the pads at the second surface of the wiring-board body, which is used mainly for conduction of current for power-supplying or grounding.

The wiring board may have features that: the via conductors corresponding to each of the first and second pads are two in number; and the via conductors corresponding to the first pad are arranged with a displacement of at least 30 degrees in angle in a rotational direction in the plan view, with respect to the via conductors corresponding to the second pad. This suppresses the via conductors connected in pairs to corresponding ones of the pads adjacent to each other at the same plane, from being aligned in a straight line in planar view, and thereby allows the above effect (1) to be produced more certainly. The displacement in angle in the rotational direction is set to 30 degrees or more because, when the displacement is less than 30 degrees, some of the via conductors (the via groups) is likely to be aligned in a straight line in planar view. In case that each of the via groups connecting the pads of a first-surface side to the pads of a second-surface side is composed of two via conductors, the via groups adjacent to each other in planar view have a displacement of 45 degrees or 90 degrees therebetween, for example.

The wiring board may have features that: the via conductors corresponding to each of the first and second pads are three or more in number, and are individually arranged at corner areas of a regular polygon with three or more sides in the plan view; and the via conductors corresponding to the first pad are arranged with a displacement of at least 30 degrees in angle in a rotational direction in the plan view, with respect to the via conductors corresponding to the second pad. This suppresses the via conductors connected in groups to corresponding ones of the pads adjacent to each other at the same plane, from being aligned in a straight line in planar view, and thereby allows the above effect (1) to be produced more certainly.

The displacement in angle in the rotational direction is set to 30 degrees or more because of the same reason with the above description. In case that each of the via groups connecting the pads of first-surface side to the pads of second-surface side is composed of three via conductors formed at corner areas of a regular triangle (specifically, formed at positions in vicinities of corners of the regular triangle) in planar view, the via groups adjacent to each other in planar view have a displacement of 60 degrees therebetween, for example. In another case that each of the via groups connecting the pads of first-surface side to the pads of second-surface side is composed of four via conductors formed at corner areas of a regular square in planar view, the via groups adjacent to each other in planar view have a displacement of 45 degrees therebetween, for example. Incidentally, "the displacement in angle in the rotational direction" described above indicates a displacement in rotational angle of 30 degrees or more around a centroid of the pad.

The wiring board may have features that the via conductors corresponding to the first pad are different in number from the via conductors corresponding to the second pad. According to this, the number of the via conductors connected to each pad is different between the pads adjacent to each other in the same plane. This suppresses the via conductors easily from being aligned in a straight line in a direction along the internal layer boundary plane, and thereby allows the above effect (1) to be produced more certainly.

The wiring board may have features that: the wiring-board body includes at least two of the insulator layers that are upper and lower insulator layers adjacent to each other in the thickness direction of the wiring-board body between the first surface and the second surface, and define the internal layer boundary plane at which the pads are formed; each of the pads at the internal layer boundary plane is connected to corresponding ones of the via conductors extending through the upper insulator layer and is connected to corresponding ones of the via conductors extending through the lower insulator layer; and in the plan view, the via conductors extending through the upper insulator layer and corresponding to the each of the pads is arranged differently from the via conductors extending through the lower insulator layer and corresponding to the each of the pads. This produces the following effect (2) in addition to the above effect (1).

(2) The pads are formed at each of the internal layer boundary planes existing in each between the insulator layers adjacent to each other in the thickness direction of the wiring-board body. At each of the internal layer boundary plane, the via conductors connected to the pad through the upper insulator layer are arranged differently, in planar view, from the via conductors connected to the pad through the lower insulator layer. This suppresses the via conductors connected between each pair of the pads adjacent in the thickness direction of the wiring-board body, from being aligned in a straight line in planar view, and thereby suppresses both of a crack in a direction along the internal layer boundary plane and a crack in the thickness direction of the wiring-board body. Accordingly, the wiring board is further improved in precision of its shape and dimensions, and in stability of its electrical characteristics.

The wiring board may have features that the via conductors extending through the upper insulator layer and corresponding to the each of the pads are different in number from the via conductors extending through the lower insulator layer and corresponding to the each of the pads. According to this, the pads are formed at each of the internal layer boundary planes existing in each between the insulator layers adjacent to each other in the thickness direction of the wiring-board body. At each of the internal layer boundary planes, the via conductors connected to the pad through the upper insulator layer are different in number from the via conductors connected to the pad through the lower insulator layer. This allows the above effect (2) to be produced more easily.

BRIEF DESCRIPTION OF THE DRAWINGS

FIGS. 6X1 and 6X2 are partial horizontal sectional views respectively along an arrow X1-X1 and an arrow X2-X2 shown in FIG. 6A. FIGS. 6Y1 and 6Y2 are partial horizontal sectional views along with FIGS. 6X1 and 6X2, which show an alternative arrangement of the via conductors with respect to FIGS. 6X1 and 6X2.

MODE(S) FOR CARRYING OUT THE INVENTION

Figure 1:
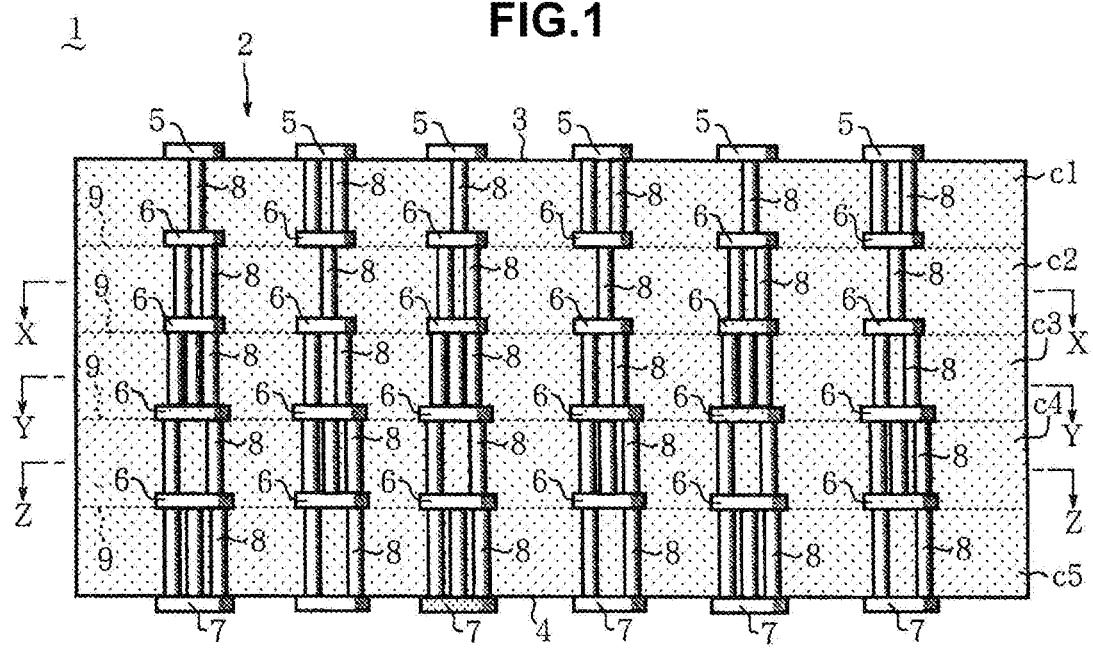
FIG. 1 is a vertical sectional view of a wiring board according to one aspect of the present invention.

The following describes embodiments of the present invention. FIG. 1 is a vertical sectional view of a wiring board 1 according to one aspect of the present invention. As shown in FIG. 1, the wiring board 1 is composed of a stack of ceramic layers (insulator layers) c1 to c5 and includes: a wiring-board body 2 including a first surface 3 and a second surface 4 opposite to the first surface 3; first-surface pads 5 formed at the first surface 3 and arranged in grid in planar view; second-surface pads 7 formed at the second surface 4 and arranged in grid in planar view; internal layer pads 6 formed at each of internal layer boundary planes 9 and arranged in grid in planar view at each plane; and via conductors 8 that connect between corresponding pairs of the first-surface pad 5 and the internal layer pad 6 adjacent to each other in the thickness direction of the wiring-board body 2, and between corresponding pairs of the internal layer pads 6 adjacent to each other in the thickness direction, and between corresponding pairs of the internal layer pad 6 and the second-surface pad 7 adjacent to each other in the thickness direction. The ceramic layers c1 to c5 are made of alumina, for example. The pads 5, 6, and 7 and the via conductors 8 are mainly made of tungsten (simply referred to as W hereinafter) or molybdenum (simply referred to as Mo hereinafter). Each of the internal layer pads 6 has a circular shape in planar view. Each of the first-surface pads 5 and the second-surface pads 7 has a shape that is not limited to a circle but may be any shape such as a rectangle and a square.

Figure 2A:
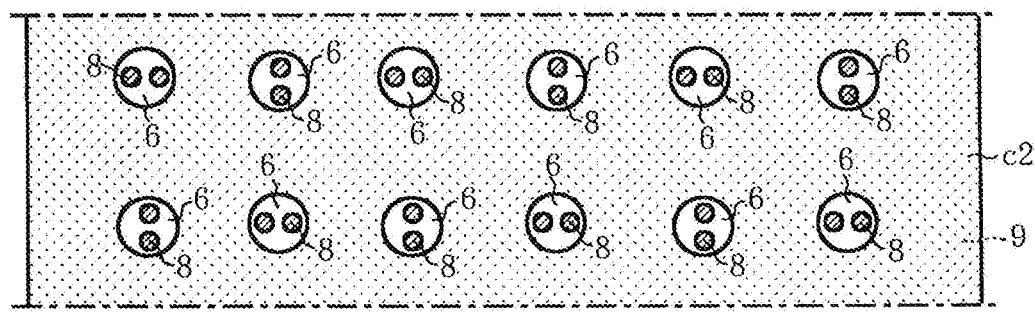
FIG. 2A is a partial horizontal sectional view along an arrow X-X shown in FIG. 1.

As shown in FIG. 1, in the wiring-board body 2, a pair of two via conductors 8 extends through the ceramic layer c1 or c2 being an upper layer and connects: between a corresponding pair of the pad 5 at the first surface 3 of the wiring-board body 2 and the pad 6 at the internal layer boundary plane 9 beneath and adjacent to the first surface 3; or between a corresponding pair of the pad 6 at the internal layer boundary plane 9 between the ceramic layers c1 and c2 and the pad 6 at the internal layer boundary plane 9 between the ceramic layers c2 and c3. For example, as shown in FIG. 2A, with regard to the pairs of via conductors 8 connecting between corresponding pairs of the pad 6 at the internal layer boundary plane 9 between the ceramic layers c1 and c2 and the pad 6 at the internal layer boundary plane 9 between the ceramic layers c2 and c3, the pair of via conductors 8 connected to a first one of the pads 6 is arranged with a displacement of 90 degrees in a rotational direction in planar view with respect to the pair of via conductors 8 connected to a second one of the pads 6 adjacent to the first one in a direction along the internal layer boundary plane 9 (lengthwise or breadthwise direction). Consequently, the via conductors 8 connected in pairs to the adjacent pads 6 are aligned in a straight line in none of the lengthwise and breadthwise directions and a diagonal direction in planar view. In this aspect of the present invention, the pairs of two via conductors 8 connected to corresponding ones of the adjacent pads 6 serve as the via groups.

Figure 2B:
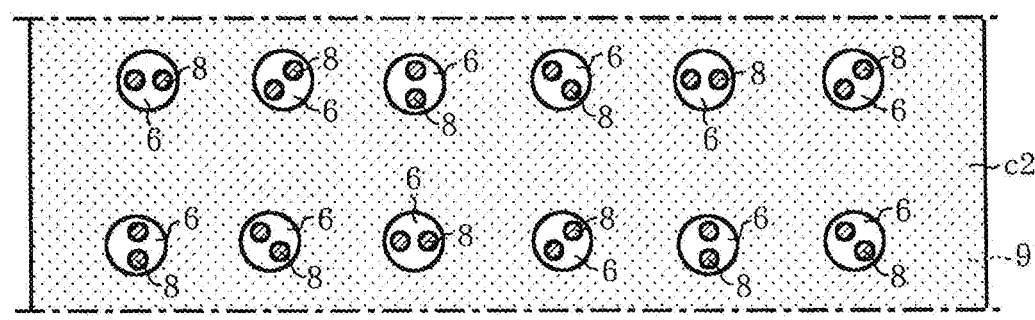
FIG. 2B is a partial horizontal sectional view showing an alternative arrangement of via conductors with respect to FIG. 2A.

Otherwise, as shown in FIG. 2B, with regard to the pairs of via conductors 8 connecting between corresponding pairs of the pads 6 as described above, the pair of via conductors 8 connected to the first one of the pads 6 may be arranged with a displacement of 45 degrees or 90 degrees in the rotational direction in planar view with respect to the pair of via conductors 8 connected to the second one of the pads 6 adjacent to the first one in the direction along the internal layer boundary plane 9. Consequently, the via conductors 8 connected in pairs to the adjacent pads 6 are aligned in a straight line in none of the lengthwise, breadthwise, and diagonal directions in planar view. In addition, as shown in an upper half of FIG. 1, the pairs of via conductors 8 that respectively extend through the ceramic layers c1 and c2 and are adjacent to each other have a displacement of 90 degrees therebetween in arrangement in planar view.

Figure 3A:
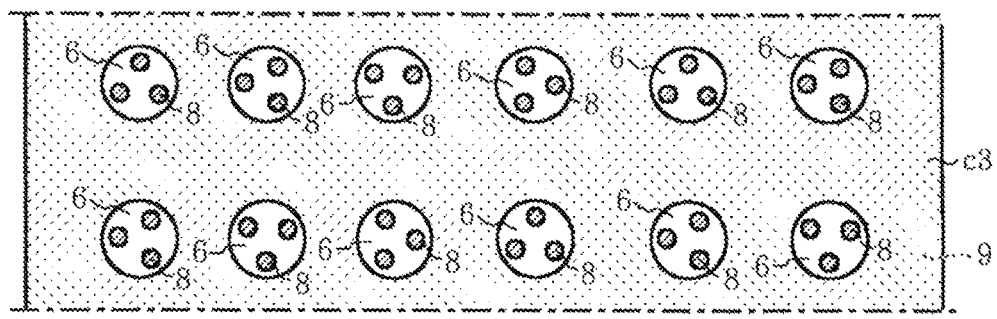
FIG. 3A is a partial horizontal sectional view along an arrow Y-Y shown in FIG. 1.

As shown in FIG. 1, in the wiring-board body 2, a group of three via conductors 8 (plurality of via conductors 8) extends through the ceramic layer c3 being a middle layer and connects between a corresponding pair of the pads 6 adjacent to each other in the thickness direction across the ceramic layer c3. The three via conductors 8 of each group are arranged such that centers of the via conductors 8 are individually located at corner areas of a regular triangle (a virtual one) in planar view. As shown in FIG. 3A, with regard to the groups of three via conductors 8 connecting between corresponding pairs of the pads 6 formed respectively in a pair of the internal layer boundary planes 9 adjacent to each other in the thickness direction across the ceramic layer c3 being the middle layer, the group of via conductors 8 connected to a first one of the pads 6 is arranged with a displacement of 30 degrees in the rotational direction in planar view with respect to the group of via conductors 8 connected to a second one of the pads 6 adjacent to the first one in the direction along the internal layer boundary plane 9 (lengthwise or breadthwise direction). In this aspect of the present invention, the groups of three via conductors 8 connected to corresponding ones of the adjacent pads 6 serve as the via groups.

Figure 3B:
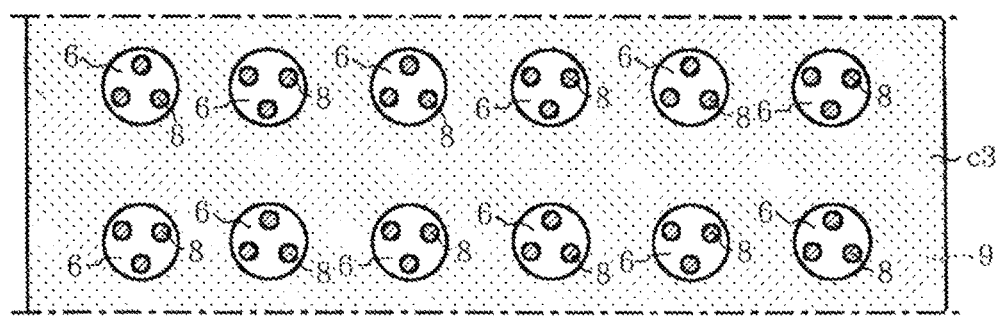
FIG. 3B is a partial horizontal sectional view showing an alternative arrangement of the via conductors with respect to FIG. 3A.

Otherwise, as shown in FIG. 3B, the group of via conductors 8 connected to the first one of the pads 6 may be arranged with a displacement of 180 degrees in the rotational direction in planar view with respect to the group of via conductors 8 connected to the second one of the pads 6 adjacent to the first one in the direction along the internal layer boundary plane 9. Consequently, as shown in FIGS. 3A and 3B, the via conductors 8 connected in groups of three to the adjacent pads 6 are arranged to be hardly aligned in a straight line in any one of the lengthwise, breadthwise, and diagonal directions in planar view.

Figure 4A:
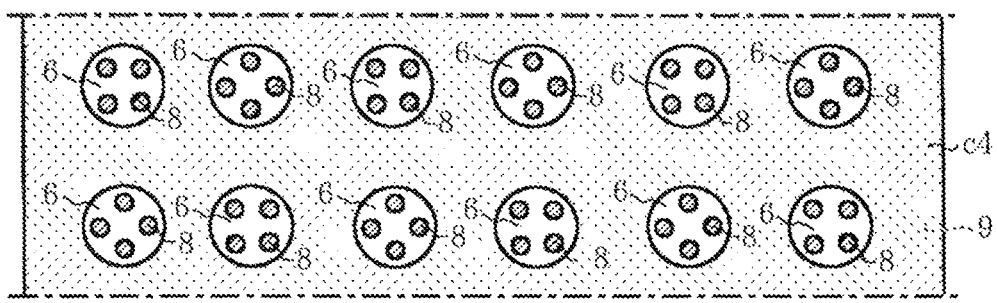
FIG. 4A is a partial horizontal sectional view along an arrow Z-Z shown in FIG. 1.

As shown in a lower half of FIG. 1, in the wiring-board body 2, groups of four via conductors 8 each of which extends through the ceramic layer c4 or c5 being a lower layer connect the internal layer pads 6 at the internal layer boundary plane 9 between the ceramic layers c3 and c4 to the second-surface pads 7 at the second surface 4 of the wiring-board body 2. The four via conductors 8 of each group are arranged such that centers of the via conductors 8 are individually located at corner areas of a regular square in planar view. As shown in FIG. 4A, with regard to the groups of four via conductors 8 which individually connect between the internal layer pads 6 and between the internal layer pads 6 and the second-surface pads 7, the group of via conductors 8 connected to a first one of the pads 6 is arranged with a displacement of 45 degrees in the rotational direction in planar view with respect to the group of via conductors 8 connected to a second one of the pads 6 adjacent to the first one in the direction along the internal layer boundary plane 9 (lengthwise or breadthwise direction).

Figure 4B:
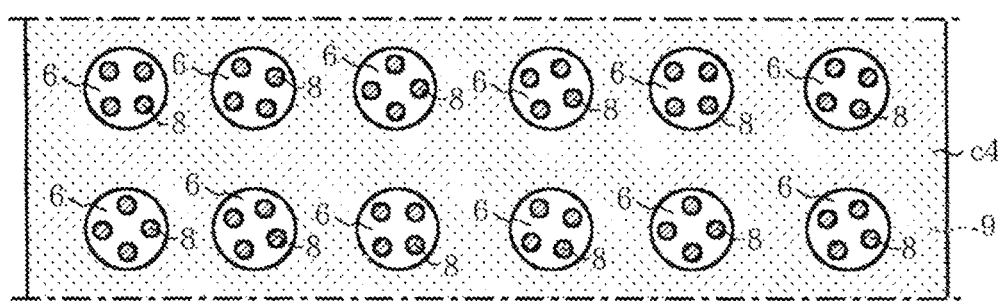
FIG. 4B is a partial horizontal sectional view showing an alternative arrangement of the via conductors with respect to FIG. 4A.

Otherwise, as shown in FIG. 4B, with regard to the groups of four via conductors 8 which individually connect between the pads 6 etc. as described above, the group of via conductors 8 connected to the first one of the pads 6 may be arranged with a displacement of 30 degrees or 45 degrees in the rotational direction in planar view with respect to the group of via conductors 8 connected to the second one of the pads 6 adjacent to the first one in the direction along the internal layer boundary plane 9 (lengthwise or breadthwise direction). Consequently, as shown in FIGS. 4A and 4B, the via conductors 8 connected in groups of four to the adjacent pads 6 are arranged to be hardly aligned in a straight line in any one of the lengthwise, breadthwise, and diagonal directions in planar view. In this aspect of the present invention, the groups of four via conductors 8 connected to corresponding ones of the adjacent pads 6 serve as the via groups.

Figure 5A:
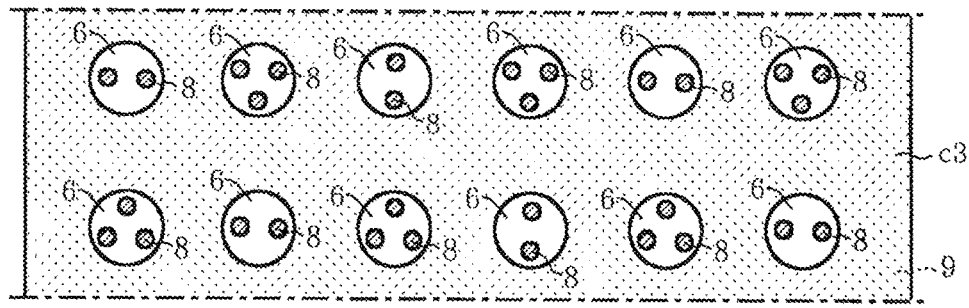
FIGS. 5A and 5B are partial horizontal sectional views showing arrangements of the via conductors, wherein number of the via conductors connected to one pad is not unified in each drawing.

FIG. 5A shows still another aspect of the present invention in which, between the pairs of upper and lower internal layer pads 6 interposing the ceramic layer c3 being the middle layer of the wiring-board body 2, the pairs of two via conductors 8 and the groups of three via conductors 8 are provided alternately in the direction along the internal layer boundary plane 9 (lengthwise or breadthwise direction), wherein the via conductors 8 connected in pairs of two or in groups of three to the adjacent internal layer pads 6 are arranged to be hardly aligned in a straight line. Specifically, as shown in FIG. 5A, the pair of via conductors 8 connected to a first one of the pads 6 is arranged with a displacement of 90 degrees in the rotational direction in planar view with respect to the pair of via conductors 8 connected to a second one of the pads 6 at two pads away from the first one in the breadthwise direction of the drawing, whereas the pairs of via conductors 8 are provided in an upper row and a lower row in FIG. 5A with a diagonal shift between the upper row and the lower row for a shift of one pad interval in the lateral direction. On the other hand, as shown in FIG. 5A, arrangements of the groups of three via conductors 8 connected to alternate ones of the pads 6 in the breadthwise direction of the drawing are same in each of the upper row and the lower row, whereas the groups of three via conductors 8 are provided in the upper row and the lower row in FIG. 5A with a diagonal shift between the upper row and the lower row for a shift of one pad interval in the lateral direction, and the groups of via conductors 8 in the upper row are arranged with a displacement of 180 degrees in angle in the rotational direction in planar view with respect to the groups of via conductors 8 in the lower row.

Figure 5B:
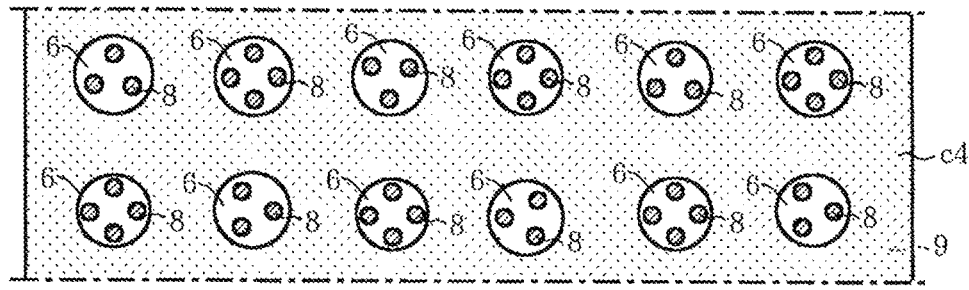

FIG. 5B shows still another aspect of the present invention in which, between the pairs of upper and lower internal layer pads 6 interposing the ceramic layer c4 being the lower layer of the wiring-board body 2, the groups of three via conductors 8 and the groups of four via conductors 8 are provided alternately in the direction along the internal layer boundary plane 9 (lengthwise or breadthwise direction), wherein the via conductors 8 connected in groups of three or four to the adjacent pads 6 are arranged to be hardly aligned in a straight line. Specifically, as shown in FIG. 5B, the group of three via conductors 8 connected to a first one of the pads 6 is arranged with a displacement of 180 degrees in the rotational direction in planar view with respect to the group of three via conductors 8 connected to a second one of the pads 6 at two pads away from the first one in the breadthwise direction of the drawing, whereas the groups of three via conductors 8 are provided in an upper row and a lower row in FIG. 5B with a diagonal shift between the upper row and the lower row for a shift of one pad interval in the lateral direction and with a rotational shift of 30 degrees in planar view. On the other hand, as shown in FIG. 5B, arrangements of the groups of four via conductors 8 connected to alternate ones of the pads 6 in the breadthwise direction of the drawing are same in the upper row and the lower row, whereas the groups of four via conductors 8 are provided in the upper row and the lower row with a diagonal shift between the upper row and the lower row for a shift of one pad interval in the lateral direction. As clearly described above, the effect (1) is produced by the wiring board 1 in which the via conductors 8 connected in groups to the pads 6 etc. adjacent to each other in the direction along the internal layer boundary plane 9 etc. are arranged differently between the adjacent pads.

Figure 6A:
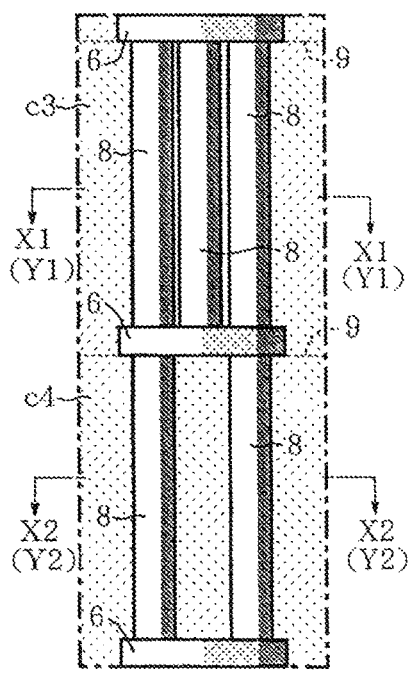
FIG. 6A is a partial vertical sectional view of the wiring board, which shows a section in a thickness direction of insulator layers.
Figure 6A:
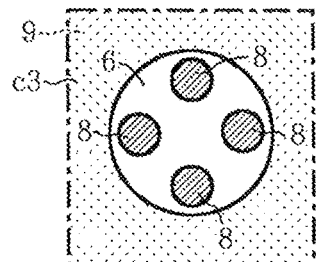
Figure 6A:
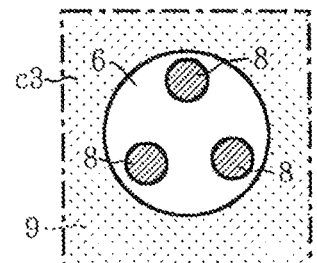
Figure 6A:
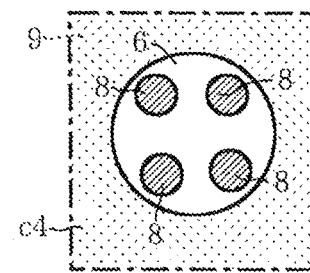
Figure 6A:
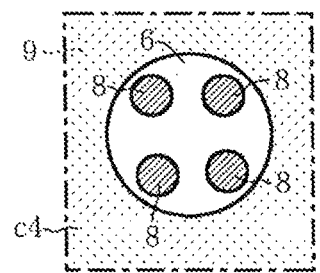

FIG. 6A is a vertical sectional view enlarging a part of the wiring board 1 shown in FIG. 1, according to still another aspect of the present invention. As shown in FIG. 6A, the group of four via conductors 8 is provided between: each pair of the upper and lower pads 6 interposing the ceramic layer c3 being the middle layer of the wiring-board body 2; and each pair of the upper and lower pads 6 interposing the ceramic layer c4 being the lower layer of the wiring-board body 2. As shown in FIGS. 6X1 and 6X2, the group of via conductors 8 extending through the ceramic layer c3 being the middle layer is arranged with a displacement of 45 degrees in the rotational direction in planar view with respect to the group of via conductors 8 extending through the ceramic layer c4 being the lower layer.

Otherwise, as shown in FIG. 6A, the group of three or four via conductors 8 is provided between: each pair of the upper and lower pads 6 interposing the ceramic layer c3 being the middle layer of the wiring-board body 2; and each pair of the upper and lower pads 6 interposing the ceramic layer c4 being the lower layer of the wiring-board body 2. In this aspect, as shown in FIGS. 6Y1 and 6Y2, the via conductors 8 are arranged such that none of the via conductors 8 extending in groups of three through the ceramic layer c3 being the middle layer and the via conductors 8 extending in group of four through the ceramic layer c4 being the lower layer are aligned continuously in the thickness direction of the wiring-board body 2 (in a vertical direction). As described above, the wiring board 1 can additionally produce the effect (2) by additionally configuring that none of the via conductors 8 of the groups extending individually through one ceramic layer cx are aligned in a straight line in the thickness direction of the wiring-board body 2.

Figure 7A:
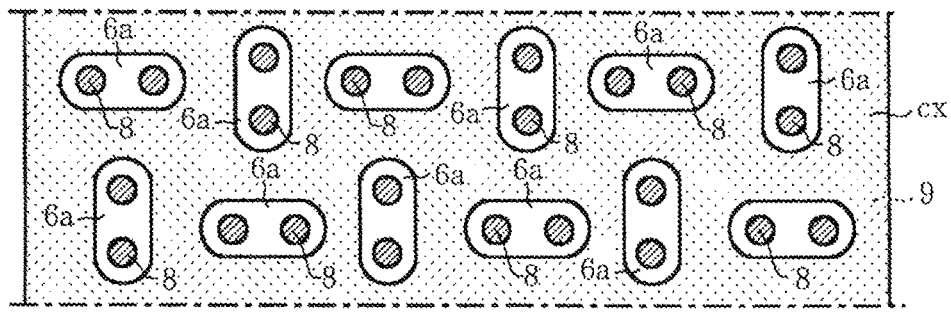
FIGS. 7A to 7D are partial horizontal sectional views along with the preceding drawings, which show arrangements of the via conductors with various shapes of the pads.

FIG. 7A is a partial horizontal sectional view along with the preceding drawings, which shows an arrangement of pairs of via conductors 8 that employ pads 6a having another shape. In one of a pair of the upper and lower internal layer boundary planes 9 interposing the ceramic layer cx that is one of the ceramic layers c1 to c5 of the wiring-board body 2, the pads 6a having an oval shape in planar view are arranged such that each pad 6a has a major axis whose rotational angle is displaced by 90 degrees around its centroid in planar view with respect to another pad 6a adjacent in the direction along the internal layer boundary planes 9, whereas each pair of the upper and lower pads 6a opposite to each other across the ceramic layer cx is provided with the pair of two via conductors 8 therebetween wherein the two via conductors 8 in pair are individually located at both ends of each pad 6a in its major axis direction. As described above, the crack inside the wiring-board body 2 is more certainly suppressed by configuring that: each pad 6a is arranged with the displacement of 90 degrees in the rotational direction in planar view with respect to another pad 6a adjacent in the direction along the internal layer boundary planes 9; and also each pair of via conductors 8 connected individually to the both ends of the pad 6a is arranged with the displacement of 90 degrees in the rotational direction in planar view with respect to another pair adjacent in the direction along the internal layer boundary planes 9.

Figure 7B:
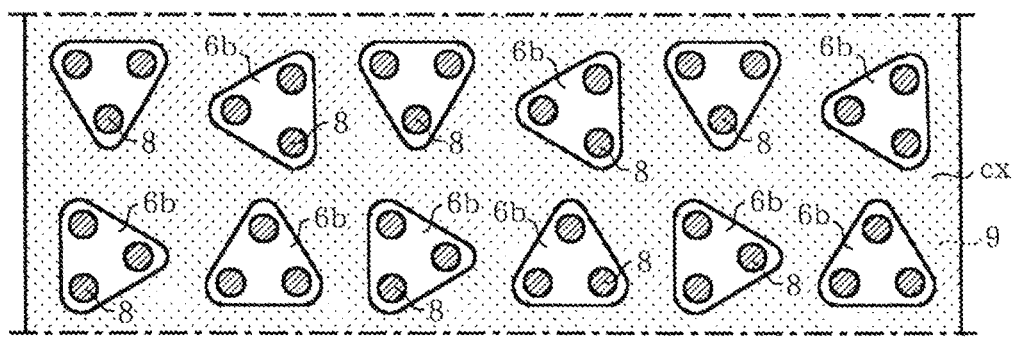

FIG. 7B is a partial horizontal sectional view along with the preceding drawings, which shows an arrangement of groups of three via conductors 8 that employ pads 6b having still another shape. In one of the pair of upper and lower internal layer boundary planes 9 interposing the ceramic layer cx, the pads 6b having a regular triangular shape in planar view are arranged such that each pad 6b is displaced by 30 degrees or 90 degrees in rotational angle around its centroid in planar view with respect to another pad 6b adjacent in the direction along the internal layer boundary planes 9, whereas each pair of the upper and lower pads 6b opposite to each other across the ceramic layer cx is provided with the group of three via conductors 8 therebetween wherein the three via conductors 8 in group are individually located at corner areas of each pad 6b. As described above, the crack inside the wiring-board body 2 is more certainly suppressed by configuring that: each pad 6b is arranged with the displacement of 30 degrees or 90 degrees in the rotational direction in planar view with respect to another pad 6b adjacent in the direction along the internal layer boundary planes 9; and also each group of three via conductors 8 connected individually to the corner areas of the pad 6b are arranged with the displacement of 30 degrees or 90 degrees in the rotational direction in planar view with respect to another group adjacent in the direction along the internal layer boundary planes 9.

Figure 7C:
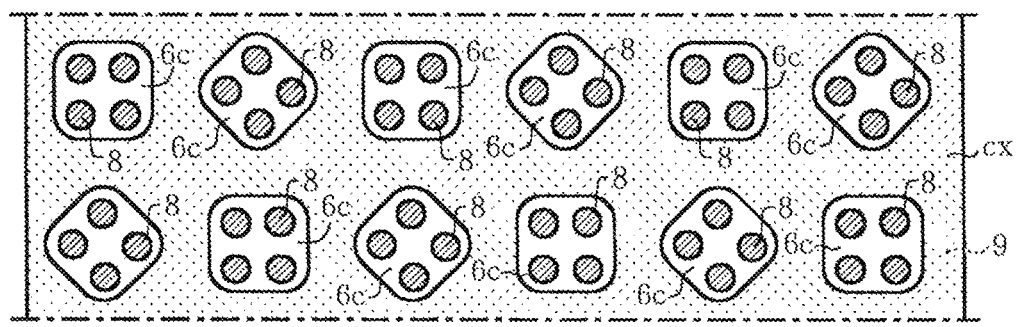

FIG. 7C is a partial horizontal sectional view along with the preceding drawings, which shows an arrangement of groups of four of the via conductors 8 that employ pads 6c having still another shape. In one of the pair of upper and lower internal layer boundary planes 9 interposing the ceramic layer cx, the pads 6c having a regular square shape in planar view are arranged such that each pad 6c is displaced by 45 degrees in rotational angle around its centroid in planar view with respect to another pad 6c adjacent in the direction along the internal layer boundary planes 9, whereas each pair of the upper and lower pads 6c opposite to each other across the ceramic layer cx is provided with the group of four via conductors 8 therebetween wherein the four via conductors 8 in group are individually located at corner areas of each pad 6c. As described above, the crack inside the wiring-board body 2 is more certainly suppressed by configuring that: each pad 6c is arranged with the displacement of 45 degrees in the rotational direction in planar view with respect to another pad 6c adjacent in the direction along the internal layer boundary planes 9; and also each group of four via conductors 8 connected individually to the corner areas of the pad 6c are arranged with the displacement of 45 degrees in the rotational direction in planar view with respect to another group adjacent in the direction along the internal layer boundary planes 9.

Figure 7D:
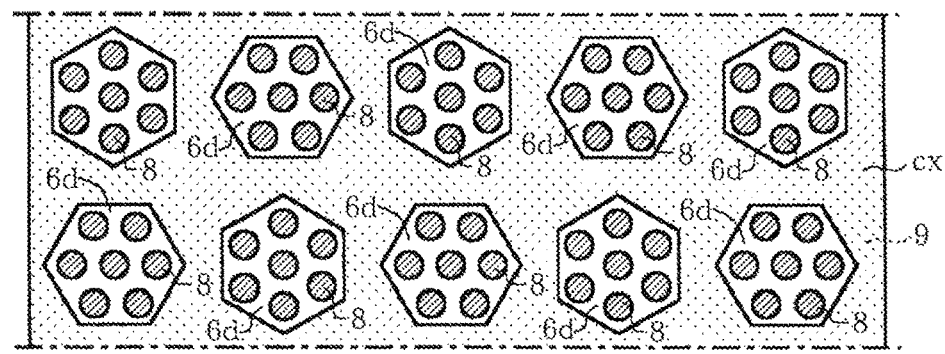

FIG. 7D is a partial horizontal sectional view along with the preceding drawings, which shows an arrangement of groups of seven of the via conductors 8 that employ pads 6d having still another shape. In one of the pair of upper and lower internal layer boundary planes 9 interposing the ceramic layer cx, the pads 6d having a regular hexagonal shape in planar view are arranged such that each pad 6d is displaced by 30 degrees in rotational angle around its centroid in planar view with respect to another pad 6d adjacent in the direction along the internal layer boundary planes 9, whereas each pair of the upper and lower pads 6d opposite to each other across the ceramic layer cx is provided with the group of seven via conductors 8 therebetween wherein the seven via conductors 8 in group are individually located at corner areas and a center of each pad 6d. As described above, the crack inside the wiring-board body 2 is more certainly suppressed by configuring that: each pad 6d is arranged with the displacement of 30 degrees in the rotational direction in planar view with respect to another pad 6d adjacent in the direction along the internal layer boundary planes 9; and also each group of seven via conductors 8 connected individually to the corner areas and the center of the pad 6d are arranged with the displacement of 30 degrees in the rotational direction in planar view with respect to another group adjacent in the direction along the internal layer boundary planes 9.

The present invention is not limited to the above embodiments. For example, the insulator layers composing the wiring-board body is not limited to the alumina-made one described above, but may be made of high-temperature-baked ceramic such as mullite and aluminum nitride, or low-temperature-baked ceramic such as glass-ceramic, or resin such as epoxy-based one. In case that the insulator layers are made of the low-temperature-baked ceramic or the resin, conductive components such as the pads 5 to 7 and the via conductors 8 are mostly made of copper or silver. In addition, the wiring-board body may be composed of a single insulator layer, and the single insulator layer may be provided with a relay board. Otherwise, the single insulator layer may be provided with two or more layers of some kind that are stacked on the single insulator layer. For example, these stacked layers may be any number of resin insulator layers stacked on one side or both sides of a ceramic core board (the single insulator layer).

Moreover, the wiring board may be configured that an internal layer wiring of any pattern is formed somewhere in the internal layer boundary plane 9 between a pair of the ceramic layers cx except for areas covered with the internal layer pads 6, and is electrically connected to the internal layer pads 6. The wiring-board body 2 may be configured to include a cavity that opens in a central area of the first surface 3 in planar view and includes a bottom surface at which the first-surface pads 5 are formed.

Furthermore, the internal layer pads 6 may be configured to have in planar view a shape of a regular pentagon, or a regular polygon with seven or more sides, or a variation of these regular polygons, wherein each of the internal layer pads 6 has corner areas to which the via conductors 8 are individually connected. Otherwise, the internal layer pads 6 may be configured to have in planar view a shape of a cross or a star, wherein each of the internal layer pads 6 has end areas or corner areas to which the via conductors 8 are individually connected. The first-surface pads 5 and the second-surface pads 7 may be arranged connectably to all of the via conductors 8 connected in parallel and in groups to the internal layer pads 6 formed at the internal layer boundary plane 9 of the wiring-board body 2.

Although the adjacent pads 6 or 7 are shown in a matrix arrangement of two-by-six in the above embodiments, the matrix arrangement may be formed of any number of the pads. Furthermore, the embodiments about the arrangement of the adjacent pads 6 or 7 and the via conductors 8 connected in groups to the adjacent pads 6 or 7 may be adopted either in a part of the wiring-board body 2 of the wiring board 1 or all over the wiring-board body 2. Specifically, in the wiring board 1 including the wiring-board body 2 composed of the stack of the insulator layers (such as the five ceramic layers c1 to c5), the above embodiments may be adopted to only the arrangement of the via conductors 8 that extend through each of the ceramic layers c1 and c2 being two layers next to the first surface 3 of the wiring-board body 2 and are connected to the pads 6 formed between the ceramic layers c1 and c2. Otherwise, the above embodiments may be adopted to only the arrangement of the via conductors 8 that extend through each of the ceramic layers c4 and c5 being two layers next to the second surface 4 of the wiring-board body 2 and are connected to the pads 6 formed between the ceramic layers c4 and c5.

Furthermore, the above embodiments may be adopted to only the arrangement of the via conductors 8 extending through one of the insulator layers (such as the five ceramic layers c1 to c5). Otherwise, the arrangement of the via conductors 8 according to the above embodiments may be adopted in only a part of the wiring board 1 in planar view. In view of the suppression of stress described above and view of productivity, the via conductors 8 connected in groups to the pads 6 and 7 arranged in grid in planar view are preferred to be made of a common material and/or be formed to have a common volume and/or be organized in groups of a common number of the via conductors 8. The pads 6 and 7 may be configured that they are arranged in zigzag in planar view and each pad 6 or 7 is connected to the via conductors 8, within the scope of the present invention.

INDUSTRIAL APPLICABILITY

The present embodiments serve to certainly provide a wiring board and a method for manufacturing the same, the wiring board hardly causing a crack in an insulator layer due to arrangement of via conductors wherein a plurality of the via conductors are arranged in parallel between each of pairs of pads opposite to each other across the insulator layer.

What is claimed is:

1. A wiring board comprising:
a wiring-board body including a first surface and a second surface opposite to the first surface, and including at least one insulator layer;
pads formed at at least one of the first surface and the second surface and an internal layer boundary plane of the wiring-board body, the one defining a first plane; and
via conductors connected to corresponding ones of the pads at the wiring-board body, and arranged in parallel to extend in a thickness direction of the wiring-board body,
wherein:
each of first and second ones of the pads adjacent to each other in a plan view at the first plane is connected to corresponding ones of the via conductors;
the via conductors corresponding to the first pad are arranged differently from the via conductors corresponding to the second pad, in the plan view;
the via conductors corresponding to the first pad are different in number from the via conductors corresponding to the second pad;
the via conductors corresponding to each of the first and second pads are three or more in number, and are individually arranged at corner areas of a regular polygon with three or more sides in the plan view; and
the via conductors corresponding to the first pad are arranged with a displacement of at least 30 degrees in angle in a rotational direction in the plan view, with respect to the via conductors corresponding to the second pad.

2. A wiring board comprising:
a wiring-board body including a first surface and a second surface opposite to the first surface, and including at least one insulator layer;
pads formed at at least one of the first surface and the second surface and an internal layer boundary plane of the wiring-board body, the one defining a first plane; and
via conductors connected to corresponding ones of the pads at the wiring-board body, and arranged in parallel to extend in a thickness direction of the wiring-board body,
wherein:
each of first and second ones of the pads adjacent to each other in a plan view at the first plane is connected to corresponding ones of the via conductors;
the via conductors corresponding to the first pad are arranged differently from the via conductors corresponding to the second pad, in the plan view;
the via conductors corresponding to the first pad are different in number from the via conductors corresponding to the second pad;
the wiring-board body includes at least two of the insulator layers that are upper and lower insulator layers adjacent to each other in the thickness direction of the wiring-board body between the first surface and the second surface, and define the internal layer boundary plane at which the pads are formed;
each of the pads at the internal layer boundary plane is connected to corresponding ones of the via conductors extending through the upper insulator layer and is connected to corresponding ones of the via conductors extending through the lower insulator layer; and
in the plan view, the via conductors extending through the upper insulator layer and corresponding to the each of the pads is arranged differently from the via conductors extending through the lower insulator layer and corresponding to the each of the pads.

3. The wiring board according to claim 2, wherein:
the via conductors extending through the upper insulator layer and corresponding to the each of the pads are different in number from the via conductors extending through the lower insulator layer and corresponding to the each of the pads.

* * * * *